(12) United States Patent
Kim et al.

(10) Patent No.: US 8,436,385 B2
(45) Date of Patent: *May 7, 2013

(54) LIGHT EMITTING DEVICE PACKAGE

(75) Inventors: Wan Ho Kim, Gwangju (KR); Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/114,996

(22) Filed: May 24, 2011

(65) Prior Publication Data

US 2012/0080701 A1    Apr. 5, 2012

Related U.S. Application Data

(63) Continuation of application No. 12/622,613, filed on Nov. 20, 2009, now Pat. No. 8,188,498.

(30) Foreign Application Priority Data

Nov. 25, 2008 (KR) .................. 10-2008-0117579

(51) Int. Cl.
*H01L 33/00* (2010.01)

(52) U.S. Cl.
USPC ............... 257/98; 257/99; 257/100; 257/676; 257/680; 257/E23.031

(58) Field of Classification Search .................... 257/98, 257/99, 100, 676, 680
See application file for complete search history.

(56) References Cited

U.S. PATENT DOCUMENTS

| | | | |
|---|---|---|---|
| 5,821,615 A | 10/1998 | Lee | |
| 6,459,130 B1 | 10/2002 | Arndt et al. | |
| 6,559,379 B2 | 5/2003 | Solanki et al. | |
| 6,608,334 B1 * | 8/2003 | Ishinaga | 257/100 |
| 7,499,288 B2 | 3/2009 | Tanaka et al. | |
| 2003/0189830 A1 | 10/2003 | Sugimoto et al. | |
| 2004/0041222 A1 | 3/2004 | Loh | |
| 2006/0022216 A1 | 2/2006 | Chikugawa | |
| 2006/0043407 A1 | 3/2006 | Okazaki | |

(Continued)

FOREIGN PATENT DOCUMENTS

| | | |
|---|---|---|
| JP | 11-204838 A | 7/1999 |
| JP | 3137823 B2 | 2/2001 |

(Continued)

OTHER PUBLICATIONS

Office Action mailed Nov. 23, 2011 in co-pending U.S. Appl. No. 12/622,613.

(Continued)

*Primary Examiner* — Wai Sing Louie
(74) *Attorney, Agent, or Firm* — Birch, Stewart, Kolasch & Birch, LLP

(57) ABSTRACT

A light emitting device package is provided. The light emitting device package comprises a package body comprising a first cavity, and a second cavity connected to the first cavity; a first lead electrode, at least a portion of which is disposed within the second cavity; a second lead electrode, at least a portion of which is disposed within the first cavity; a light emitting device disposed within the second cavity; a first wire disposed within the second cavity, the first wire electrically connecting the light emitting device to the first lead electrode; and a second wire electrically connecting the light emitting device to the second lead electrode.

20 Claims, 3 Drawing Sheets

U.S. PATENT DOCUMENTS

| | | |
|---|---|---|
| 2006/0124941 A1 | 6/2006 | Lee et al. |
| 2007/0019476 A1 | 1/2007 | Diorio et al. |
| 2007/0194336 A1 | 8/2007 | Shin et al. |
| 2008/0048201 A1 | 2/2008 | Kim et al. |
| 2008/0224162 A1 | 9/2008 | Min et al. |
| 2010/0133560 A1* | 6/2010 | Kim et al. ........................ 257/89 |

FOREIGN PATENT DOCUMENTS

| | | |
|---|---|---|
| JP | 2002-94122 A | 3/2002 |
| JP | 2007-27765 A | 2/2007 |
| KR | 10-2005-0017979 A | 2/2005 |
| KR | 10-0580765 B1 | 5/2006 |
| KR | 10-0691441 B1 | 2/2007 |
| KR | 10-2007-0082614 A | 8/2007 |
| KR | 10-0772433 B1 | 10/2007 |
| KR | 10-2008-0008767 A | 1/2008 |
| KR | 10-2008-0018096 A | 2/2008 |
| KR | 10-2008-0023389 A | 3/2008 |
| KR | 10-2008-0079745 A | 9/2008 |

OTHER PUBLICATIONS

U.S. Notice of Allowance mailed Mar. 8, 2012 for U.S. Appl. No. 12/622,613.

U.S. Office Action dated Oct. 12, 2012, for U.S. Appl. No. 13/114,946.

U.S. Office Action dated Oct. 12, 2012, for U.S. Appl. No. 13/114,957.

Japanese Office Action dated Feb. 12, 2013 in Japanese Application No. 2011-537360.

* cited by examiner

LIGHT EMITTING DEVICE PACKAGE

CROSS-REFERENCE TO RELATED APPLICATIONS

This application is a Continuation of application Ser. No. 12/622,613 filed on Nov. 20, 2009 now U.S. Pat. No. 8,188,498, which claims priority to Korean Application No. 10-2008-0117579 filed on Nov. 25, 2008. The entire contents of all of the above applications are hereby incorporated by reference.

BACKGROUND OF THE INVENTION

Embodiments of the invention relate to a light emitting device package.

Group III-V nitride semiconductors have been in the spotlight as a core material for light emitting devices, such as light emitting diodes (LEDs), laser diodes (LDs), and the like, because of their excellent physical and chemical properties. Group III-V nitride semiconductors are composed of a semiconductor material having the chemical formula of $In_xAl_yGa_{1-x-y}N$ (where $0 \leq x \leq 1$, $0 \leq y \leq 1$, $0 \leq x+y \leq 1$). LEDs are a kind of semiconductor device that converts electricity into infrared rays or light by using characteristics of a compound semiconductor to transmit and receive a signal, and they are used as light sources.

LEDs or LDs made of nitride semiconductor materials are widely adopted in light emitting devices for obtaining light, and are applied as light sources for various products, for example, a light emission part for a keypad of a mobile phone, an electrical sign board, and a lighting device.

SUMMARY OF THE INVENTION

Embodiments provide a light emitting device package in which a wire and a light emitting device are disposed within one cavity.

Embodiments provide a light emitting device package in which a light emitting device and one wire are disposed in a phosphor layer disposed within a cavity.

Embodiments provide a light emitting device package in which a lead electrode is formed by one cavity of a multi-layered cavity.

Embodiments provide a light emitting device package in which at least one lead electrode is exposed to a bottom surface of a package body.

An embodiment provides a light emitting device package including a package body comprising a first cavity, and a second cavity connected to the first cavity; a first lead electrode, at least a portion of which is disposed within the second cavity; a second lead electrode, at least a portion of which is disposed within the first cavity; a light emitting device disposed within the second cavity; a first wire disposed within the second cavity, the first wire electrically connecting the light emitting device to the first lead electrode; and a second wire electrically connecting the light emitting device to the second lead electrode.

An embodiment provides a light emitting device package including a package body comprising a first cavity having an opened upper portion and a second cavity connected to the first cavity; a first lead electrode, a first portion of the first lead electrode extending along a bottom of the package body within the second cavity and a second portion of the first lead electrode extending along a lower portion of the first cavity; a portion of a second lead electrode disposed within the first cavity; and a light emitting device disposed on the first lead electrode.

An embodiment provides a light emitting device package including a package body comprising a first cavity having an opened upper portion, and a second cavity connected to the first cavity at a lower portion thereof; a first lead electrode having a portion which cups the second cavity, the first lead electrode extending from the package body toward a first direction; a second lead electrode having a surface exposed to the first cavity; a light emitting device disposed within the second cavity; a first wire which electrically connects the first lead electrode to the light emitting device and disposed within the second cavity; and a phosphor layer disposed within the second cavity.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In the description, a size and a thickness of each layer in the accompanying drawings is illustrated as an example, and thus, are not limited thereto.

Figure 1:
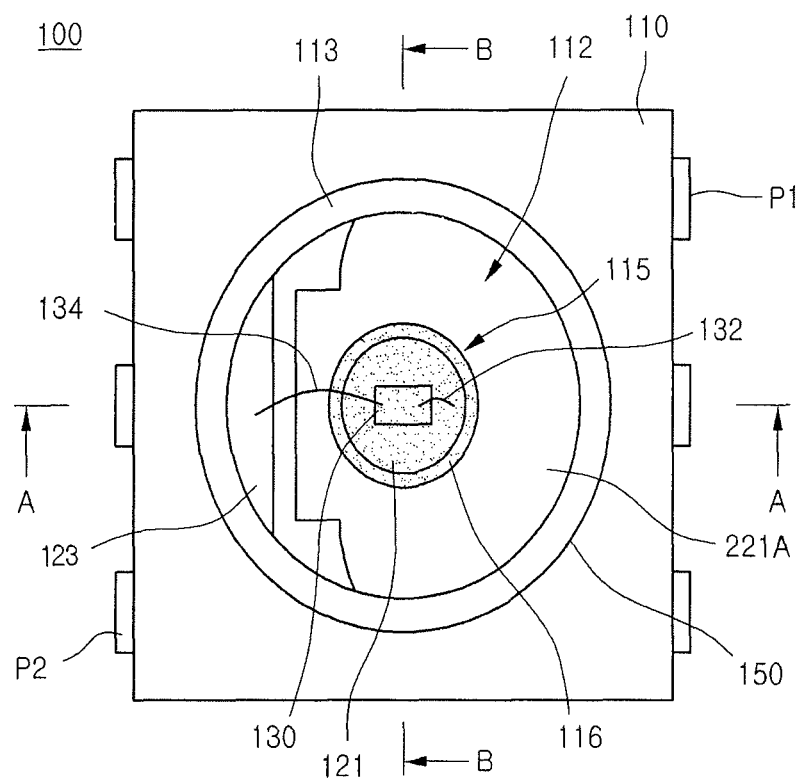
FIG. 1 is a plan view of a light emitting device package according to a first embodiment.
Figure 2:
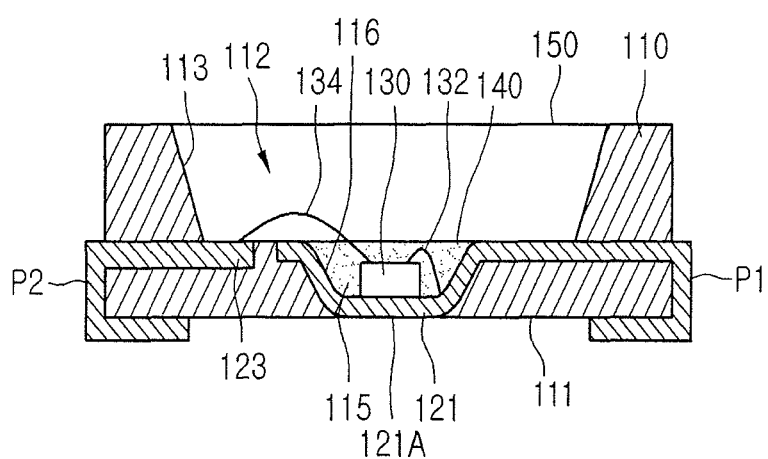
FIG. 2 is a side sectional view taken along line A-A of FIG. 1.

FIG. 1 is a plan view of a light emitting device package according to a first embodiment. FIG. 2 is a side sectional view taken along line A-A of FIG. 1, and FIG. 3 is a side sectional view taken along line B-B of FIG. 1.

Figure 3:
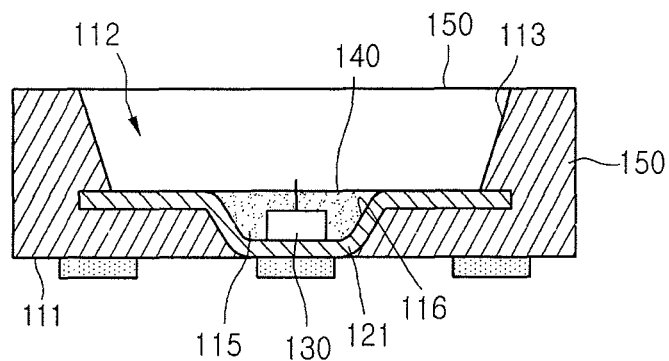
FIG. 3 is a side sectional view taken along line B-B of FIG. 1.

Referring to FIGS. 1 to 3, a light emitting package 100 including a package body 110, a first cavity 112, a second cavity 115, lead electrodes 121 and 123, a light emitting device 130, a phosphor layer 140, and a resin layer 150.

The package body 110 may include one of a printed circuit board (PCB) type substrate, a ceramic type substrate, and a lead frame type substrate. The package body 110 may have an injection molding structure using a resin material or a stacked structure, but is not limited thereto. Hereinafter, for convenience of description, the lead frame type substrate will be described in the following embodiments as an example. The package body 110 may be integrally injection-molded using the resin material (e.g., polyphthalamide (PPA)) or a material having a high reflective characteristic.

The package body 110 may be formed of the resin material such as polycarbonate (PC) and PPA, a silicon material, or a ceramic material. The package body 110 may have the injection molding structure or the stacked structure.

A plurality of lead electrodes 121 and 123 is disposed on the package body 110. The lead electrodes 121 and 123 may include at least one of a PCB type electrode, a ceramic type electrode, a lead frame type electrode, and a via type electrode. Hereinafter, for convenience of description, the lead frame type electrode will be described in the following embodiments as an example.

The first cavity 112 and the second cavity 115 are formed in the package body 110. The first cavity 112 has an opened upper side, and the second cavity 115 is defined at a predetermined position under the first cavity 112. As shown, a portion of the bottom of the first cavity 112 is defined by an annular surface of the package body with an opening in a central portion thereof.

A surface of the first cavity 112 may have a circular shape, a polygonal shape, an oval shape, or any other shape, and the first cavity 112 may have a predetermined depth. A circumferential surface of the first cavity 112 may be perpendicular to a bottom surface thereof or inclined outwardly (or inwardly) at a predetermined angle.

The second cavity 115 is formed under a central portion of the first cavity 112 in the central portion to the annular surface of the package body that defines the bottom of the first cavity, at approximately the line B-B of FIG. 1, but such is not required. The size of the second cavity 115 may be smaller than the size of the first cavity 112. A surface of the second cavity 115 may have a circular shape, an oval shape, a polygonal shape, or other shapes. The second cavity 115 has a diameter less than that of the first cavity 112 and a predetermined depth. Here, the first and second cavities 112 and 115 may have the same surface configuration, for example, a reflective cup having a circular shape or a polygonal shape, but the shape of the reflective cup is not limited thereto.

As shown in FIG. 1, the second cavity 115 is located in approximately a central portion of the package body 110. With respect to the line B-B of FIG. 1 that approximately bisects the second cavity 115. Therein, a first side of the first cavity 112 about the line B-B may be referred to, which contains both a portion of the second lead electrode 123 and a portion of the first lead electrode 121. The opposite side of the first cavity 112 about the line B-B from the first side may be referred to as a second side, which contains the first lead electrode 121, but not the second lead electrode 123. The second cavity 115 straddles both the first and second sides of the first cavity 112.

The second cavity 115 contains a portion of a first lead electrode 121 so that a first lead electrode 121 has a portion which cups the second cavity 115. The portion of the first lead electrode 121 cups the second cavity 115 by entirely covering a side surface and a bottom of the second cavity 121, but not the exposed top.

The first lead electrode 121 extends from one side of a bottom surface of the first cavity 112 to the other side thereof. A second cavity 115 is defined between one side and the other side of the first cavity 112 and has a predetermined depth. The first lead electrode 121 is formed in a side of the bottom surface of the first cavity 112, i.e., either an entire surface or a majority surface of the side of the bottom surface of the first cavity 112.

The first lead electrode 121 is spaced from the second lead electrode 123 at the other side of the first cavity 112.

The first lead electrode 121 defines a bottom surface and a circumferential surface of the second cavity 115. That is, the first lead electrode 121 forms the second cavity 115.

The second cavity 115 formed by the first lead electrode 121 may have a vessel or cup shape having a smooth curvature. The first lead electrode 121 may be perpendicular or inclined to a circumferential surface of the second cavity 115 in the bottom surface 111 of the package body 110.

The first lead electrode 121 may have the other end P1 exposed to one side of the package body 110 and bent downwardly from the package body 110 or bent toward a bottom surface of the package body 110. The other end P1 of the first lead electrode 121 may be used as an external electrode.

Referring to FIG. 2, a portion of the first lead electrode 121 constitutes or formed along a bottom surface and a circumferential surface of the second cavity 115, and a bottom surface 121A of the second cavity 115 is disposed on a bottom surface 111 of the package body 110, but such is not required. The first lead electrode 121 is disposed under the light emitting device 130 within the second cavity 115. Heat transferred from the light emitting device 130 may be radiated to the outside through a bottom surface of the first lead electrode 121. Thus, heat may be effectively radiated through the first lead electrode 121.

The bottom surface of the first lead electrode 121 disposed within the second cavity 115 may be flush with the bottom surface of the package body 110.

Referring to FIG. 1, the other end P1 of the first lead electrode 121 is spaced from one end of the second lead electrode 123. The first lead electrode 121 constitutes a portion of the bottom surface of the first cavity 112 or an entire surface of the second cavity 115.

The second lead electrode 123 has one end disposed on a portion of the first cavity 112 of the package body 110 and spaced a predetermined distance from the first lead electrode 121. The second lead electrode 123 may have the other end P2 exposed to the other side of the package body 110 and bent downwardly from the package body 110 or bent toward the bottom surface of the package body 110. The other end P2 of the second lead electrode 123 may be used as a lead electrode.

The other end P1 of the first lead electrode 121 may be provided in one or plurality and the other end P2 of the second lead electrode 123 may be provided in one or plurality. That is, the other end P1 of the first lead electrode 121 may be divided into a plurality of pieces, and the other end P2 of the second lead electrode 123 may be divided into a plurality pieces. As a result, electronic reliability may be improved.

The first and second lead electrodes 121 and 123 are separated from each other at a portion of the first cavity 112 to form an opened structure. At least one light emitting device 130 is disposed on the first lead electrode 121, and the light emitting device 130 is attached to the first lead electrode 121 using an adhesive. The light emitting device 130 is connected to the first lead electrode 121 using a first wire 132 and connected to the second lead electrode 123 using a second wire 134. Here, the first wire 132 is bonded to the first lead electrode 121 and the light emitting device 130 within the second cavity 115. The second wire 134 has one end bonded to the light emitting device 130 disposed within the second cavity 115 and the other end bonded to the second lead electrode 123 disposed within the first cavity 112.

The first wire 132 may be disposed within the phosphor layer 140. In this case, since the first wire 132 is disposed within the phosphor layer 140, defect occurrence and efficiency drooping due to the resin layer 150 or the formation thereof may be reduced or prevented. Also, the first wire 132 may be disposed at a position higher or lower than that of a surface of the phosphor layer 140, but is not limited thereto. Here, since the first wire 132 is disposed within the second cavity 115 or the phosphor layer 140, a wire bonding defect may be reduced or prevented, and also, light efficiency may be improved.

The light emitting device 130 may include at least one blue LED chip. Alternatively, a colored LED chip such as a green LED chip or a red LED chip or an ultraviolet (UV) LED chip may be used as the light emitting device 130. A lateral-type semiconductor light emitting device will be described below as an example of the LED chip.

Since the first wire 132 is disposed within the second cavity 115, the first wire 132 may be disposed further close to the light emitting device 130 and disposed on a layer different from the second wire 134.

The phosphor layer 140 is disposed within the second cavity 115, and the resin layer 150 is disposed within the first cavity 112. For example, the phosphor layer 140 may include a layer in which a yellow phosphor is added to a resin material such as silicon or epoxy. The phosphor layer 140 absorbs a portion of light emitted from the blue LED chip to emit yellow light. For example, when the light emitting device 130 includes the blue LED chip, and the phosphor layer 140 contains the yellow phosphor, the light emitting package 100 emits white light by mixing blue light with yellow light.

A surface of the phosphor layer 140 may have a flat shape, a concave shape, or a convex shape, but is not limited thereto.

When the first wire 132 is disposed within the second cavity 115, it may reduce or prevent a portion of a phosphor layer 140 dispensed or disposed into the second cavity 115 from ascending along the first wire 132 and the second wire 134. As a result, a color-coordinate distribution of light emitted from the light emitting device 130 may be reduced.

When the first and second wires 132 and 134 are disposed within the first cavity 112, the phosphor layer 140 disposed in the second cavity 115 may ascend along the first and second wires 132 and 134 during the dispensing or disposing process for the phosphor layer 140. As a result, the color-coordinate distribution through the phosphor layer 140 is wide to cause a non-uniform color-coordinate distribution of a white LED. Therefore, brightness and manufacturing yield may be reduced. According to embodiments, the first wire 132 may be disposed within the second cavity 115 to improve the color-coordinate distribution, the brightness, and the manufacturing yield.

According to the first embodiment, the second cavity 115 may be formed using the first lead electrode 121 to increase a light reflection amount.

The resin layer 150 may be disposed within the first cavity 112 and formed of the resin material such as the silicon (or silicon containing) or the epoxy, and in addition, the phosphor may be added or not be added to the resin layer 150, but is not limited thereto. A surface of the resin layer 150 may have one of a flat shape, a concave shape, a convex shape, an irregular shape, or other shapes.

Figure 4:
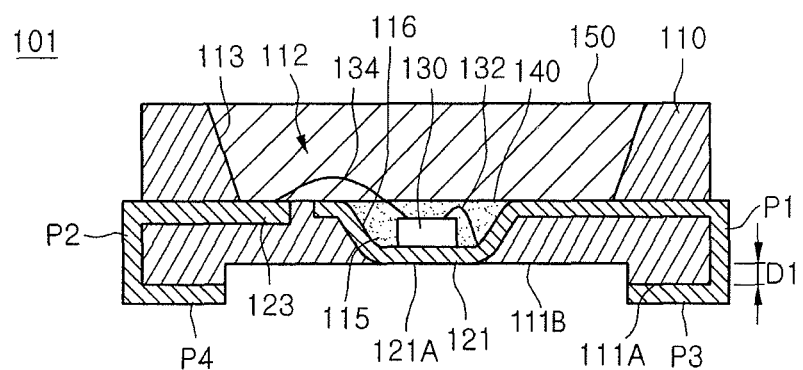
FIG. 4 is a plan view of a light emitting device according to a second embodiment.

FIG. 4 is a plan view of a light emitting device according to a second embodiment. In the description of a second embodiment, components and operations equal to those of the first embodiment will be described with reference to the first embodiment, and duplicated descriptions will be omitted.

Referring to FIG. 4, a light emitting device package 101 includes a package body 110 having a lower groove 111B, a first cavity 112, a second cavity 115, lead electrodes 121 and 123, a light emitting device 130, a phosphor layer 140, and a resin layer 150.

The lower groove 111B of the package body 110 may be stepped with respect to an outer bottom surface 111A of the package body 110. The lower groove 111B of the package body 110 may be concave to a predetermined depth with respect to the outer bottom surface 111A of the package body 110. The lower groove 111B and the outer bottom surface 111A of the package body 110 have thicknesses different from each other. Due to such a thickness difference D1, a space is defined in the lower groove 111B of the package body 110. As a result, a bottom surface 121A of the first lead electrode 121 disposed within the second cavity 115 is exposed to the lower groove 111B of the package body 110.

Thus, heat is effectively radiated through the bottom surface 121A of the first lead electrode 121 disposed within the second cavity 115. Also, the lower groove 111B of the package body 110 may reduce or prevent the package body 110 from being short-circuited due to solder failure when the package body 110 is mounted on a board PCB. A heat sink plate may be disposed in the lower groove 111B of the package body 110.

The first lead electrode 121 has one end P3 disposed on the outer bottom surface 111A of the package body 110, and the second lead electrode 123 has the other end P4 disposed on the opposite outer bottom surface 111A of the package body 110.

Figure 5:
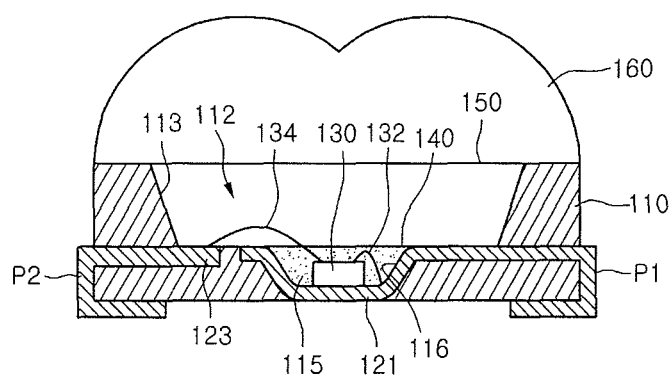
FIG. 5 is a plan view of a light emitting device according to a third embodiment.

FIG. 5 is a plan view of a light emitting device according to a third embodiment. In the description of a third embodiment, components and operations equal to those of the first embodiment will be described with reference to the first embodiment, and duplicated descriptions will be omitted.

Referring to FIG. 5, a light emitting device package 100A includes a package body 110, a first cavity 112, a second cavity 115, lead electrodes 121 and 123, a light emitting device 130, a phosphor layer, a resin layer 150, and a lens layer 160.

An injection molded part having a predetermined shape is disposed on the package body 110, and then, a transparent resin material is injected thereon to form the lens layer 160 having a shape equal to that of an inner surface of the injection molded part.

The lens layer 160 has a structure that convexly protrudes in hemisphere shapes toward the outer sides of the package body 110 about the center or a center portion of the package body 110 (when viewed from the package body). For example, the lens layer 160 may be formed in a parabolic shape having a smoothly bent or curved surface. In other embodiments, an abruptly changing surface or a step surface is also possible.

The lens layer 160 condenses light emitted from the first cavity 112 into a predetermined region. The configuration of the lens layer 160 is just one example and is not limited to the parabolic shape.

Figure 6:
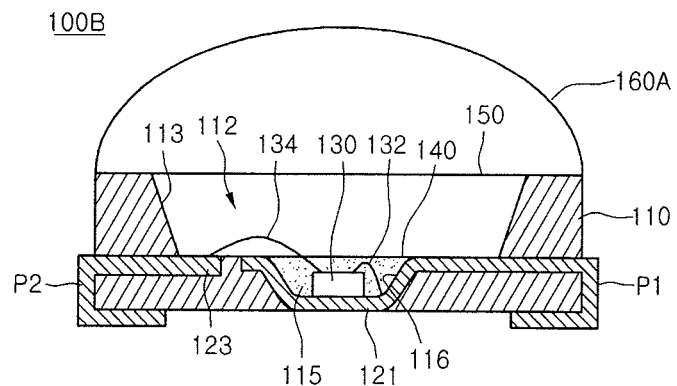
FIG. 6 is a plan view of a light emitting device according to a fourth embodiment.

FIG. 6 is a plan view of a light emitting device according to a fourth embodiment. In the description of a fourth embodiment, components and operations equal to those of the first embodiment will be described with reference to the first embodiment, and duplicated descriptions will be omitted.

Referring to FIG. 6, a light emitting device package 100B includes a package body 110, a first cavity 112, a second cavity 115, lead electrodes 121 and 123, a light emitting device 130, a phosphor layer 140, a resin layer 150, and a lens layer 160A.

The lens layer 160A is formed in a convex hemisphere shape on the package body 110. The lens layer 160A may be formed by an injection molded part and/or separately attached.

Referring to FIGS. 5 and 6, the lens layer 160 or 106A disposed on the package body 110 may be variously modified in configuration and is not limited to the above-described structure.

Figure 7:
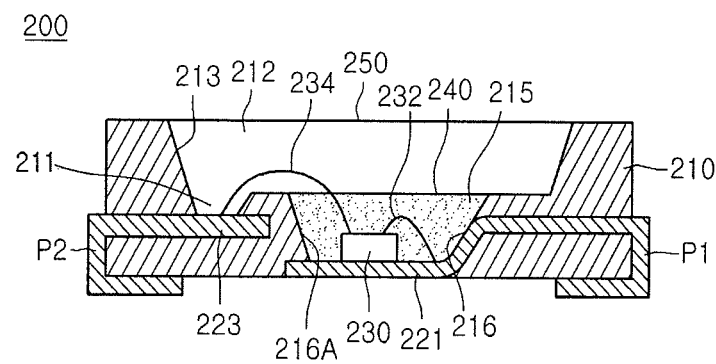
FIG. 7 is a plan view of a light emitting device according to a fifth embodiment.

FIG. 7 is a plan view of a light emitting device according to a fifth embodiment. In the description of a fifth embodiment, components and operations equal to those of the first embodiment will be described with reference to the first embodiment, and duplicated descriptions will be omitted.

Referring to FIG. 7, a light emitting device package 200 includes a package body 210, a first cavity 212, a second cavity 215, lead electrodes 221 and 223, a light emitting device 230, a phosphor layer 240, and a resin layer 250.

The first cavity 212 having a predetermined depth is defined within the package body 210. The second cavity 215 having a predetermined depth is defined in a central region of the first cavity 212.

A portion 216A of a lateral surface of the second cavity 215 may be defined by the package body 210, and remaining portions of the second cavity 215 may be defined by the first lead electrode 221 and the package body 210. That is, a side of the first lead electrode 221 may be stepped to constitute a bottom surface of the second cavity 215, and most of the lateral surface of the second cavity 215 may be defined by the package body 210. Also, a portion of the first lead electrode 221 disposed within the second cavity 215 may be exposed to a bottom surface of the package body 210 to effectively radiate heat.

A groove 211 of the first cavity 212 is formed by an injection modeling to expose a portion of the second lead electrode 223. Here, most of a bottom surface of the first cavity 212 may be defined by the package body 210.

The light emitting device 230 adheres to a top surface of the first lead electrode 221 using an adhesive. The first wire 232 electrically connects the first lead electrode 221 to the light emitting device 230 within the second cavity 215, and the second wire 234 electrically connects the second lead electrode 223 exposed to the groove 211 defined in the other side of the first cavity 212 to the light emitting device 230.

The light emitting device 230 may include various color LED chips. For a case in which the light emitting device 230 is at least one blue LED chip, the phosphor layer 240 to which a yellow phosphor is added is disposed within the second cavity 215. At this time, since the first wire 232 is disposed within the second cavity 215, it may reduce or prevent a portion of the phosphor layer 240 from ascending along the wires 232 and 234. Also, in the fifth embodiment, the package body 210 may constitute all lateral surfaces 216A and 216 of the first cavity 212 and the second cavity 215.

The resin layer 250 is disposed within the first cavity 212. The resin layer 250 may be formed of a resin material such as a silicon resin or an epoxy resin, and in addition, the phosphor may be added or not be added to the resin material, but is not limited thereto.

A lens layer may be disposed on the package body 210, but is not limited thereto. Also, an outer bottom surface of the package body 210 may be stepped, like the second embodiment shown in FIG. 4.

Figure 8:
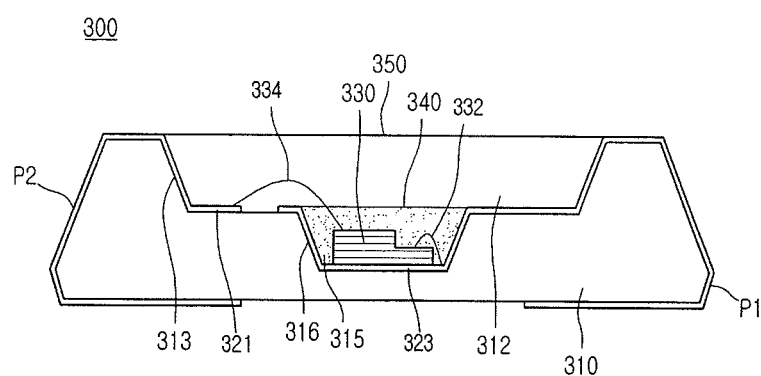
FIG. 8 is a plan view of a light emitting device according to a sixth embodiment.

FIG. 8 is a plan view of a light emitting device according to a sixth embodiment. In the description of the sixth embodiment, components and operations equal to those of the first embodiment will be described with reference to the first embodiment, and duplicated descriptions will be omitted.

Referring to FIG. 8, a light emitting device package 300 includes a package body 310, a first cavity 312, a second cavity 315, a light emitting device 330, first and second lead electrodes 321 and 323, a phosphor layer 340, and a resin layer 350.

The package body 310 may be formed of a silicon material, for example, the package body 310 may be formed using a wafer level package (WLP) technology and have a polyhedral shape (e.g., hexahedral shape). The first cavity 312 is defined inside an upper portion of the package body 310, and a surface of the first cavity 312 may have a polygonal shape, a circular shape, an oval shape, an irregular shape, or other shapes. The first cavity 312 may be formed with a predetermined depth using a dry etching process and/or a wet etching process, but is not limited thereto.

A lateral surface 313 of the first cavity 312 may be perpendicular to or inclined to a bottom surface thereof, and the lateral surface 313 may improve a light reflection amount.

The second cavity 315 having a predetermined depth is defined under a central region of the first cavity 312. The second cavity 315 may have a polygonal shape, a circular shape, an oval shape, an irregular shape, or other shapes. The second cavity 315 may be formed with a predetermined depth using a dry etching process and/or a wet etching process.

A dielectric may be disposed on a surface of the package body 310, but is not limited thereto. The first lead electrode 321 and the second lead electrode 323 are disposed on the surface of the package body 310.

The first lead electrode 321 is disposed on the other side surface of the package body 310, and the second lead electrode 323 is disposed on one side surface of the package body 310. The first lead electrode 321 is disposed along a bottom surface and a lateral surface of the first cavity 312 and along an outer surface of the other side of the package body 310 to extend up to a portion of a bottom surface of the package body 310.

The second lead electrode 323 is integrally disposed along a portion of the bottom surface of the first cavity 312, a lateral surface and a bottom surface of the second cavity 315, and the outer surface of the package body 310 to extend up to a portion of the bottom surface of the package body 310.

A mask pattern may be disposed on the first lead electrode 321 and the second lead electrode 323 to form a metal electrode layer using sputter equipment, but is not limited thereto.

Outer ends P1 and P2 of the first lead electrode 321 and the second lead electrode 323, which are disposed on the outer surface of the package body 310, may be used as external electrodes.

The light emitting device 330 adheres to the first lead electrode 321 within the first cavity 312 using an adhesive. A first wire 332 electrically connects the light emitting device 330 to the second lead electrode 323. Here, since a bonding portion of the first wire 332 is connected to the second lead electrode 323 within the second cavity 315, the first wire 332 may be disposed within the second cavity 315. Thus, it may reduce or prevent the phosphor layer 340 molded to the second cavity 315 from ascending along the first wire 332 and a second wire 334.

The second wire 334 electrically connects the light emitting device 330 to the second lead electrode 321 within the first cavity 312.

The phosphor layer 340 is disposed within the second cavity 315, and a colored phosphor, for example, a yellow phosphor may be added to a resin material such as silicon, silicon resin, or an epoxy to form the phosphor layer 340. Here, the resin layer 350 may be disposed before or after the phosphor layer 340 is hardened.

The transparent resin layer 350 is disposed within the first cavity 312. The resin layer 350 may be formed of a resin material such as silicon or epoxy, and in addition, the phosphor may be added or not added to the resin material, but is not limited thereto.

Since the first wire 332 is disposed within the second cavity 315 including the phosphor layer 340, it may reduce or prevent the phosphor layer 340 from ascending along the wires 332 and 334 to a predetermined height.

The phosphor layer 340 may have a flat shape, and the resin layer 350 may have one of a flat shape, concave shape, and a convex shape.

Technical characteristics of the first to fifth embodiments are not limited to each embodiment, but may be applicable to other embodiments. Such a selective application will be included in technical scopes of the embodiments.

The light emitting device package according to the first to fifth embodiments may be realized in a top view or side view type. Also, the light emitting device package may be disposed in an array form in a portable terminal, a notebook computer, etc. Thus, the light emitting device package may be provided as a lighting unit or variously applicable to devices such as an illumination device, an indication device, etc.

According to the embodiments, the color-coordinate distribution of the white light of the light emitting device package may be minimized.

According to the embodiments, the light emitting device package may improve the color-coordinate yield of the white light.

According to the embodiments, the color-coordinate yield may be improved, and the heat may be effectively radiated to improve the reliability of the light emitting device package.

Embodiments may provide the light emitting device package using the LED.

Embodiments may be applicable to the lighting unit such as display devices, illumination devices, and indication devices, etc.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device package, comprising:
    metal layers having at least two lead electrodes, the metal layers disposed to be spaced apart from each other;
    a semiconductor light emitting device on at least one of the metal layers;
    a package body having an upper surface, a lower surface, and an opening passing through the upper surface and the lower surface thereof, the semiconductor light emitting device being disposed within the opening, and the opening of the package body having an inclined surface configured to be upwardly broadened, a bottom of the opening being hemmed by a portion of one of the metal layers such that a surface of the portion of the at least one of the metal layers is exposed to outside of the package body; and
    a molding layer disposed in the opening of the package body,
    wherein the opening of the package body comprises a first cavity and a second cavity connected to the first cavity,
    wherein the at least two lead electrodes comprise a second lead electrode extending from the first cavity to the outside of the package body, and a first lead electrode spaced apart from the second lead electrode, the first lead electrode extending to the outside of the package body through the second cavity,
    wherein the first lead electrode has one end disposed in the first cavity, and a recessed portion disposed in a substantially center portion of the first cavity such as to coincide with the second cavity, and
    wherein the thickness of the first lead electrode is substantially uniform.

2. The semiconductor light emitting device package according to claim 1, wherein the inclined surface extends from the lower surface to the upper surface of the package body.

3. The semiconductor light emitting device package according to claim 2, wherein the inclined surface of the opening of the package body is substantially parallel to the lower surface of the package body.

4. The semiconductor light emitting device package according to claim 1, wherein the package body comprises a recess with reference to edges of the package body.

5. The semiconductor light emitting device package according to claim 1, further comprising a resin layer disposed in the opening of the package body.

6. The semiconductor light emitting device package according to claim 1, wherein
    the first lead electrode functions as a reflective structure.

7. The semiconductor light emitting device package according to claim 6, wherein the recessed portion of the first electrode corresponds to the second cavity.

8. The semiconductor light emitting device package according to claim 7, wherein a bottom surface of the recessed portion of the first lead electrode that corresponds to the second cavity is substantially flush with the lower surface of the package body.

9. The semiconductor light emitting device package according to claim 1, further comprising a separation region disposed between the first lead electrode and the second lead electrode, the separation region being disposed at a bottom of the first cavity.

10. The semiconductor light emitting device package according to claim 1, wherein the first cavity comprises an opened upper side and the second cavity is defined at a predetermined position under the first cavity, and
    a portion of a bottom of the first cavity is defined by an annular surface of the package body with the opening.

11. The semiconductor light emitting device package according to claim 1, wherein the second cavity contains a portion of the first lead electrode so that the first lead electrode has a portion which cups the second cavity.

12. The semiconductor light emitting device package according to claim 11, wherein the portion of the first lead electrode cups the second cavity by entirely covering a side surface and a bottom of the second cavity.

13. The semiconductor light emitting device package according to claim 1, further comprising a first wire disposed within the second cavity.

14. The semiconductor light emitting device package according to claim 1, wherein the first lead electrode defines a bottom surface and a circumferential surface of the second cavity.

15. The semiconductor light emitting device package according to claim 1, further comprising a phosphor layer disposed in the second cavity; and
    a first wire disposed within the phosphor layer.

16. A light unit, comprising:
    a semiconductor light emitting device package, the semiconductor light emitting device package including:

metal layers having at least two lead electrodes, the metal layers disposed to be spaced apart from each other;

a semiconductor light emitting device on at least one of the metal layers;

a package body having an upper surface, a lower surface, and an opening passing through the upper surface and the lower surface thereof, the semiconductor light emitting device being disposed within the opening, and the opening of the package body having an inclined surface configured to be upwardly broadened, a bottom of the opening being hemmed by a portion of one of the metal layers such that a surface of the portion of the at least one of the metal layers is exposed to outside of the package body; and a molding layer disposed in the opening of the package body, wherein the opening of the package body has a substantially flat portion where one end of one of the metal layers is exposed, and another end of one of the metal layers extends to the outside of the package body, wherein, in the semiconductor light emitting device package, the opening of the package body comprises a first cavity and a second cavity connected to the first cavity, wherein the at least two lead electrodes comprise a second lead electrode extending from the first cavity to the outside of the package body, and a first lead electrode spaced apart from the second lead electrode, the first lead electrode extending to the outside of the package body through the second cavity, wherein the first lead electrode has one end disposed in the first cavity, and a recessed portion disposed in a substantially center portion of the first cavity such as to coincide with the second cavity, and wherein the thickness of the first lead electrode is substantially uniform.

17. The light unit according to claim 16, wherein the semiconductor light emitting device package further comprises a separation region disposed between the first lead electrode and the second lead electrode, the separation region being disposed at a bottom of the first cavity.

18. The light unit according to claim 16, wherein the semiconductor light emitting device package further comprises a phosphor layer disposed in the second cavity; and a first wire disposed within the phosphor layer.

19. The semiconductor light emitting device package according to claim 1, wherein the package body has a barrier portion in the opening.

20. The semiconductor light emitting device package according to claim 19, wherein the barrier portion defines a recess, and the barrier portion is higher than upper surfaces of the metal layers.

* * * * *